(12) United States Patent
Zhou et al.

(10) Patent No.: US 9,634,648 B1
(45) Date of Patent: Apr. 25, 2017

(54) TRIMMING A TEMPERATURE DEPENDENT VOLTAGE REFERENCE

(71) Applicant: Xilinx, Inc., San Jose, CA (US)

(72) Inventors: Shidong Zhou, Milpitas, CA (US); Anil Kumar Kandala, Hyderabad (IN); Narendra Kumar Pulipati, Tadipatri (IN); Santosh Yachareni, Hyderabad (IN)

(73) Assignee: XILINX, INC., San Jose, CA (US)

( * ) Notice: Subject to any disclaimer, the term of this patent is extended or adjusted under 35 U.S.C. 154(b) by 153 days.

(21) Appl. No.: 14/098,222

(22) Filed: Dec. 5, 2013

(51) Int. Cl.
*H03K 3/011* (2006.01)

(52) U.S. Cl.
CPC .................... *H03K 3/011* (2013.01)

(58) Field of Classification Search
CPC .................... G05F 3/16; H03K 3/011
USPC ............... 327/356, 359, 361, 512, 513, 539
See application file for complete search history.

(56) References Cited

U.S. PATENT DOCUMENTS

| | | | |
|---|---|---|---|
| 5,614,816 A * | 3/1997 | Nahas | 323/316 |
| 5,831,845 A | 11/1998 | Zhou et al. | |
| 6,559,715 B1 | 5/2003 | Frake et al. | |
| 6,815,998 B1 | 11/2004 | Samad | |
| 7,138,868 B2 * | 11/2006 | Sanchez | H03F 3/45183 330/252 |
| 7,225,099 B1 | 5/2007 | O'Dwyer | |
| 7,696,909 B2 * | 4/2010 | Oberhuber | 341/119 |
| 7,859,918 B1 | 12/2010 | Nguyen et al. | |
| 7,936,582 B1 | 5/2011 | Zhou et al. | |
| 8,198,724 B1 | 6/2012 | Wu et al. | |
| 8,493,130 B2 * | 7/2013 | Fukazawa et al. | 327/513 |
| 8,988,137 B2 * | 3/2015 | Furusawa et al. | 327/539 |
| 9,007,096 B1 | 4/2015 | Carey et al. | |
| 9,377,795 B1 | 6/2016 | Cical et al. | |
| 2008/0258798 A1 * | 10/2008 | Huang | H03F 3/505 327/333 |
| 2009/0085651 A1 * | 4/2009 | Liu | G05F 3/30 327/539 |

* cited by examiner

*Primary Examiner* — Lincoln Donovan
*Assistant Examiner* — Colleen O Toole
(74) *Attorney, Agent, or Firm* — Kevin T. Cuenot (57) ABSTRACT

A circuit includes a divider circuit block configured to generate a trim term signal (VBG_TRIM) that is temperature and process independent. The circuit further includes a processing circuit block configured to multiply a temperature dependent reference voltage signal (TAP_GG) by a factor, and to sum the trim term signal with a result of the multiplication to generate an output reference voltage (VGG).

15 Claims, 6 Drawing Sheets

TRIMMING A TEMPERATURE DEPENDENT VOLTAGE REFERENCE

TECHNICAL FIELD

This disclosure relates to providing a reference voltage within an integrated circuit (IC). More particularly, this disclosure relates to trimming a temperature dependent reference voltage for use within an IC across a defined temperature range.

BACKGROUND

Reference voltages available within an integrated circuit (IC) are typically temperature dependent. In order to provide a reliable and relatively constant reference voltage within the IC, the temperature dependent reference voltage is adjusted, or "trimmed." The term "trimming" means to fine tune a selected parameter of a circuit. In the case of a temperature dependent reference voltage, trimming refers to fine tuning the value of the reference voltage that is output. The reference voltage is trimmed using a trimming circuit to achieve a particular result, for example, in compliance with a specification for the IC. Trimming is typically performed as part of the IC manufacturing and testing process prior to release and/or sale of the IC.

In some ICs, the trimming circuit operates by applying a selected amount of gain to the reference voltage to be trimmed using an amplifier. The amount of gain applied by the amplifier is determined at a particular temperature referred to as the "tuning temperature." For example, the tuning temperature may be 0° C. While the reference voltage output from the tuning circuit is accurate at the tuning temperature, the reference voltage becomes less accurate as the temperature rises above the tuning temperature or falls below the tuning temperature.

For a selected temperature not equal to the tuning temperature, the amount of variance in the reference voltage compared to the desired value of the reference voltage per the specification increases with the magnitude of the difference between the selected temperature and the tuning temperature. For example, the difference between the reference voltage after trimming and the specification reference voltage is greater at a temperature of 120° C. than at 30° C. when the tuning temperature is 0° C. Even with trimming, the actual reference voltage may vary from the allowable range of the reference voltage per the specification to such a large extent that the reference voltage is no longer compliant with the specification of the IC. Such large variance in the reference voltage over the temperature range not only reduces operational efficiency of the IC, but also can result in reduced IC yield.

The present invention may address one or more of these issues.

SUMMARY

A first exemplary circuit includes a divider circuit block configured to generate a trim term signal that is temperature and process independent. The circuit also includes a processing circuit block configured to multiply a temperature dependent reference voltage signal by a factor, and to sum the trim term signal with a result of the multiplication to generate an output reference voltage.

In one aspect, the trim term signal has a voltage equal to a trim term. The trim term is a product of a band-gap reference voltage signal, a ratio of a first resistive value and a second resistive value, and a number of active transistors of a selected type within a current mirror structure of the divider circuit block. The trim term is positive or negative according to whether a p-type transistor or an n-type transistor in the current mirror structure is turned on.

The divider circuit block can include an amplifier, an output stage coupled to an output of the amplifier, and a current mirror structure coupled to an output of the output stage, wherein the current mirror generates the trim term signal.

The amplifier can include a first input coupled to a band-gap reference voltage signal and a second input. The band-gap reference voltage signal is temperature and process independent. The output stage can include a first p-transistor having a gate coupled to an output of the amplifier and a drain coupled to the second input of the amplifier; a second p-transistor having a gate coupled to the output of the amplifier; a resistor coupled to the drain of the first p-transistor; and an n-transistor having a drain and a gate coupled to a drain of the second p-transistor.

The current mirror structure can include at least one current mirror. The at least one current mirror can include a third p-transistor having a gate coupled to the output of the amplifier, control circuitry coupled to a drain of the third p-transistor, and a second n-transistor having a gate coupled to the gate of the first n-transistor and a drain coupled to the control circuitry. The control circuitry is configured to turn off both of the third p-transistor and the second n-transistor concurrently, turn on only the third p-transistor, or turn on only the second n-transistor.

The processing block can include an amplifier having a first input configured to receive the temperature dependent reference voltage signal and a second input; a p-transistor having a gate coupled to an output of the amplifier; a first resistor having a first end coupled to a drain of the p-transistor, wherein the first end of the first resistor coupled to the drain of the p-transistor forms a circuit node that generates the output reference voltage; and a second resistor having a first end coupled in series to a second end of the first resistor. The second input of the amplifier is coupled to the second end of the first resistor forming a feedback loop.

In a further aspect, the trim term signal is R1*M*(a band-gap reference voltage signal)/R3. The output reference voltage equals the temperature dependent reference voltage signal multiplied by 1+R1/R2 and summed with the trim term signal. In that case, R1 is a first resistor value of the processing circuit block; R2 is a second resistor value of the processing circuit block; R3 is a first resistor value of the divider circuit block; and M is an integer value specifying a number of active transistors of a current mirror structure of the divider circuit block.

An exemplary method of trimming a temperature dependent reference voltage includes generating a trim term signal that is temperature and process independent, multiplying a temperature dependent reference voltage signal by a factor that is temperature and process independent, and summing the trim term signal with a result of the multiplication generating an output reference voltage.

In one aspect, the trim term signal has a voltage that is a product of a band-gap reference voltage signal, a ratio of a first resistive value and a second resistive value, and a number of active transistors of a selected type within a current mirror structure from which the trim term signal is output. The voltage of the trim term signal is positive or negative according to whether a p-type transistor or an n-type transistor in the current mirror structure is turned on.

In another aspect, the trim term signal has a voltage of R1*M*(a band-gap reference voltage signal)/R3. The output reference voltage equals the temperature dependent reference voltage signal multiplied by 1+R1/R2 and summed with the trim term signal. In the foregoing example, R1 is a value of a first resistor; R2 is a value of a second resistor in series with the first resistor; R3 is a value of a third resistor; and M is an integer value specifying a number of active transistors of a current mirror structure from which the trim term signal is output. The output reference voltage is taken from a circuit node joining the first resistor and the second resistor.

A second exemplary circuit includes a first amplifier having a first input coupled to a band-gap reference voltage signal and a second input. The circuit also includes an output stage coupled to an output of the first amplifier, a current mirror structure coupled to an output of the output stage, a second amplifier including a first input configured to receive a temperature dependent reference voltage signal and a second input, and a first p-transistor having a gate coupled to an output of the second amplifier. The circuit further includes a first resistor having a first end coupled to a drain of the first p-transistor, wherein the first end of the first resistor forms a circuit node that generates an output voltage reference, and a second resistor having first end coupled in series to a second end of the first resistor. The second input of the second amplifier is coupled to the second end of the first resistor forming a feedback path.

In one aspect, the band-gap reference voltage signal is temperature and process independent. The output stage includes a second p-transistor having a gate coupled to an output of the first amplifier and a drain coupled to the second input of the first amplifier, a third p-transistor having a gate coupled to the output of the first amplifier, a third resistor coupled to the drain of the second p-transistor, and a first n-transistor having a drain and a gate coupled to a drain of the third p-transistor.

The current mirror structure includes at least one current mirror. The at least one current mirror includes a fourth p-transistor having a gate coupled to the output of the amplifier, a second n-transistor having a gate coupled to the gate of the first n-transistor, and control circuitry coupled to a drain of the fourth p-transistor and a drain of the second n-transistor. The control circuitry is configured to turn off both of the fourth p-transistor and the second n-transistor concurrently, turn on only the fourth p-transistor, or turn on only the second n-transistor.

In a further aspect, the current mirror is configured to output a trim term signal having a voltage of R1*M*(the band-gap reference voltage signal)/R3. The output reference voltage equals the temperature dependent reference voltage signal multiplied by 1+R1/R2 and summed with the trim term signal. In that case, R1 is a value of the first resistor; R2 is a value of the second resistor; R3 is a value of a third resistor coupled to the first input of the first amplifier; and M is an integer value specifying a number of active transistors of the current mirror structure.

DETAILED DESCRIPTION

While the disclosure concludes with claims defining novel features, it is believed that the various features described herein will be better understood from a consideration of the description in conjunction with the drawings. The process(es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to providing a reference voltage within an integrated circuit (IC). More particularly, this disclosure relates to trimming a temperature dependent reference voltage within an IC for use across a defined temperature range. A trimming circuit is used that allows the slope of the output reference voltage, referred to herein as VGG, to be selected to match a desired slope of VGG plotted over a specified temperature range. The trimming circuit further can adjust an offset of the plot of VGG over the temperature range with substantially little or no effect upon the slope of the line.

In one example, the trimming circuit adjusts VGG over the temperature range by summing a trim term. The trim term, which may be positive or negative, modifies VGG over the temperature range without changing the temperature coefficient of VGG. The trim term is both temperature and process independent. Accordingly, the offset of the plot of VGG over the temperature range, having established a desired slope, is either increased or decreased per the trim term with substantially little or no variation in the slope of the line.

Conventional trimming circuits generate an output reference voltage that, when plotted over a defined temperature range, has a particular slope. The slope of the plotted output reference voltage can provide the desired voltage level at the tuning temperature. However, as the temperature moves away from the tuning temperature, the output reference voltage tends to deviate by larger and larger amounts from the desired voltage level as expressed in the specification (i.e., the specification output reference voltage). Such is the case even with trimming. When using a gain-based trimming circuit, one often adjusts the slope of the output reference voltage over the temperature range through gain adjustment in the trimming circuit. This results in an output reference voltage that may deviate somewhat from the specification output reference voltage at the tuning temperature in an attempt to avoid more significant differences between the output reference voltage and the specification output reference voltage at temperature extremes. Generating a temperature dependent reference voltage that is specification compliant at temperature extremes, however, is not always feasible using a gain-only trimming circuit. Trimming circuits that rely upon the application of gain only change the temperature coefficient of the output reference voltage. As noted, an output reference voltage that is not specification compliant can result in inefficient IC operation and, in some cases, reduced IC yield.

The arrangements described within this disclosure provide a trimming circuit configured to generate values of VGG that, when plotted over the defined temperature range, have a slope that matches, or substantially matches, the slope of the desired VGG over the defined temperature range. The offset of the line representing VGG, i.e., the actual trimmed output reference voltage that is output from the trimming circuit, can be increased or decreased by the trim term without adjustment of any gain. By adjusting the offset of VGG as plotted over the temperature range using a trim term that is both process and temperature independent, a value of VGG that is highly accurate over the entire temperature range can be generated. The amount of deviation between the trimmed VGG and the specification value of VGG at temperature extremes is significantly reduced.

Figure 1:
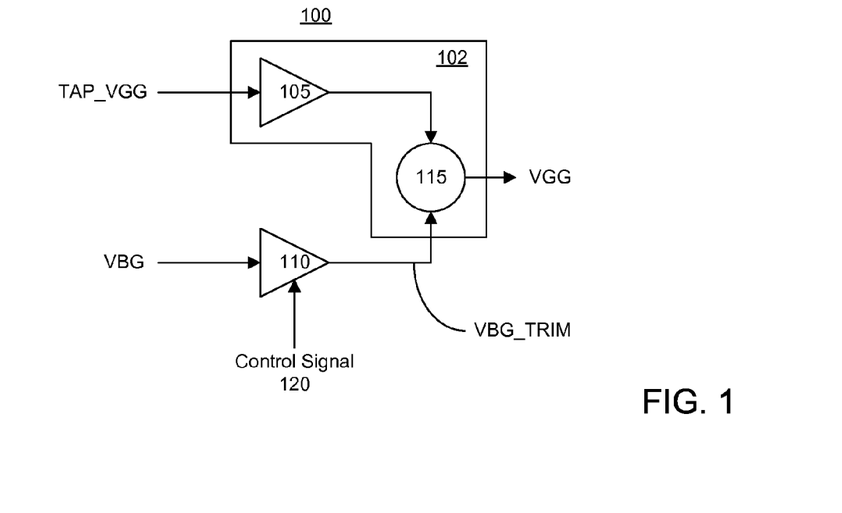
FIG. 1 is a block diagram illustrating an exemplary trimming circuit.

FIG. 1 is a block diagram illustrating an exemplary trimming circuit 100. FIG. 1 illustrates a generalized architecture for trimming circuit 100. As pictured, trimming circuit 100 includes a processing circuit block 102 and a divider circuit block 110. Processing circuit block 102 includes a multiplier circuit block 105 and a summing circuit block 115. As pictured, multiplier circuit block 105 has an input that receives a reference voltage illustrated as TAP_VGG. Divider circuit block 110 has an input that receives a reference voltage denoted as VBG.

VBG is a reference voltage signal that is generated by a band-gap voltage generator circuit (not shown). As known to those skilled in the art, a band-gap voltage generator circuit provides a voltage reference signal that is temperature independent and process independent. In this regard, VGB is a temperature independent and a process independent reference voltage signal. By comparison, TAP_VGG, which may be provided from a multi-tap portion of a band-gap voltage generator circuit, is temperature dependent. Thus, TAP_VGG is a temperature dependent reference voltage signal. TAP_VGG supplies the reference voltage that is to be trimmed using trimming circuit 100. Accordingly, TAP_VGG is independent of VBG and, as such, may be a different voltage level than VBG.

In one example, TAP_VGG is taken from a selected node of a multi-tap circuit portion of the band-gap voltage generator circuit. The particular node from which TAP_VGG is taken is specified by a tap setting for the multi-tap circuit. Each different node of the multi-tap circuit corresponds to a different tap setting and a different voltage level. For instance, each of the nodes of the multi-tap circuit that is selectable to provide an output provides an incrementally higher (or lower) voltage level. Typically, the nodes available to output TAP_VGG differ in voltage potential by a selected unit amount of voltage. The operation of band-gap voltage generator circuitry and multi-tap circuitry, being well-known to those skilled in the art, are not described in further detail.

Multiplier circuit block 105 generates an output signal by multiplying TAP_VGG by a selected factor or gain. In one aspect, since TAP_VGG has a selectable voltage level, the factor used by multiplier circuit block 105 is fixed. It should be appreciated, however, that in another exemplary implementation, TAP_VGG is fixed and the value of the factor of multiplier circuit block 105 is selectable. An output of multiplier circuit block 105 is coupled to a first input of summing circuit block 115. Accordingly, multiplier circuit block 105 provides the output signal generated by multiplying TAP_VGG by the factor to the first input of summing circuit block 115.

Divider circuit block 110 generates a trim term reference signal. In one aspect, divider circuit block 110 generates the trim term reference signal, denoted as VBG_TRIM in FIG. 1, at least in part, by dividing VBG by a divisor. An output of divider circuit block 110 is coupled to a second input of summing circuit block 115. Accordingly, divider circuit block 110 provides VBG_TRIM to the second input of summing circuit block 115.

As defined within this disclosure, the phrase "trim term" is a quantity of voltage provided by divider circuit block 110 as VBG_TRIM in FIG. 1. The trim term is expressed as a quantity that is both process and temperature independent. The trim term may be positive or negative as provided to processing circuit block 102 and summing circuit block 115. The magnitude of the trim term is determined from the value of VBG and control signal 120. In one example, control signal 120 is a multi-bit signal controlling various operational parameters of divider circuit block 110 as will be described within this disclosure in greater detail.

Processing circuit block 102, using summing circuit block 115, generates VGG by determining a sum of the output from multiplier circuit block 105 and the trim term as output from divider circuit block 110. Appreciably, when the trim term is negative, summing the noted outputs results in subtracting the trim term from the output of multiplier circuit block 105.

In general, the voltage of VGG, when plotted over a defined temperature range, has a slope that is determined by the voltage of TAP_VGG and the factor of multiplier circuit block 105. The offset of the resulting plot of VGG over the defined temperature range, e.g., the "b" term when VGG is represented by a linear expression such as "y=mx+b," is, or is dependent upon, the trim term.

Figure 2:
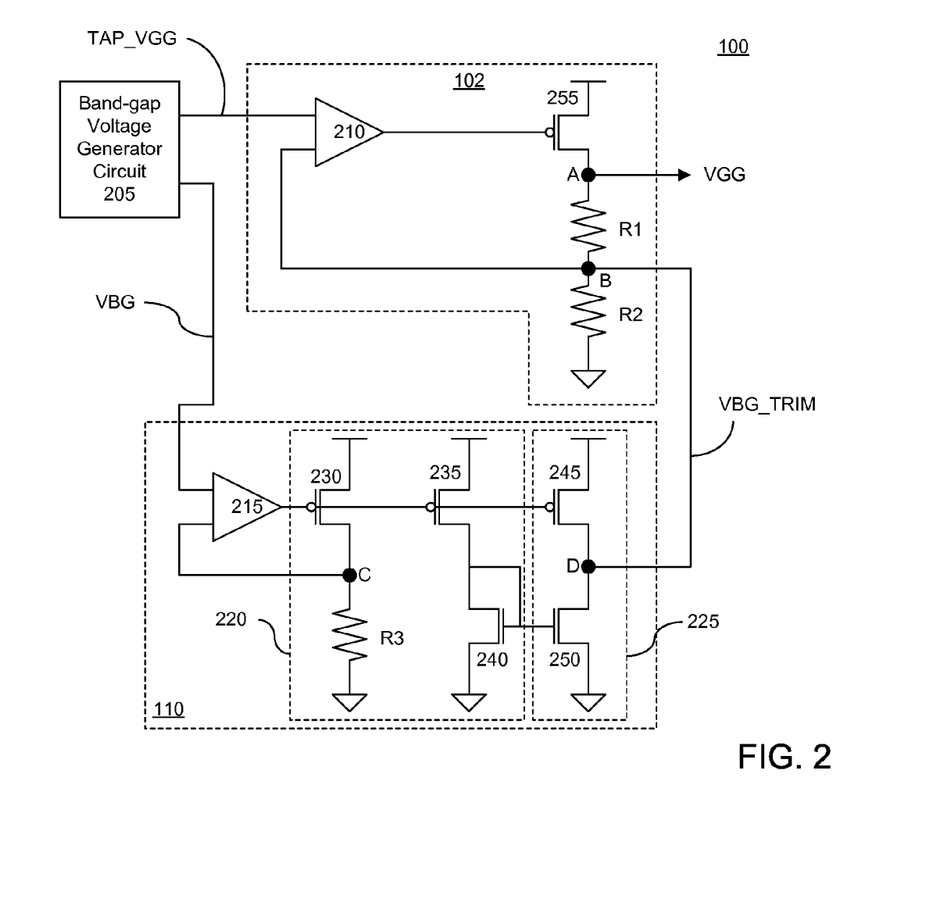
FIG. 2 is a circuit diagram illustrating an exemplary implementation of the trimming circuit of FIG. 1.

FIG. 2 is a circuit diagram illustrating an exemplary implementation of trimming circuit 100. FIG. 2 illustrates a more detailed implementation of trimming circuit 100 of FIG. 1. For purposes of illustration and example, band-gap voltage generator circuit 205 is shown to provide TAP_VGG and VBG. As pictured, trimming circuit 100 includes processing circuit block 102 and divider circuit block 110.

As discussed with reference to FIG. 1, processing circuit block 102 implements a multiplier functionality and a summing functionality which were illustrated and exemplified by multiplier circuit block 105 and summing circuit block 115. Multiplier circuit block 105 and summing circuit block 115, however, as implemented by the circuitry shown in processing block 102, share one or more components due, in part, to the use of feedback and the like. As such, the individual circuit blocks corresponding to 105 and 115 are not illustrated.

Processing circuit block 102 includes an amplifier 210. Amplifier 210, for example, may be implemented as an operational amplifier. A first input of amplifier 210 receives TAP_VGG as output from band-gap voltage generator 205. A second input of amplifier 210 receives a signal from node B, located between resistor R1 and resistor R2 of processing circuit block 102 as a feedback signal forming a feedback loop.

Divider circuit block 110 includes an amplifier 215 coupled to an output stage 220, which is further coupled to a current mirror 225 or a current mirror structure. A current mirror structure is a circuit that includes one or more current mirrors as described and illustrated herein in greater detail. Amplifier 215, for example, may be implemented as an operational amplifier. Output stage 220 includes p-type transistors (p-transistors) 230 and 235, an n-type transistor (n-transistor) 240, and a resistor R3.

As pictured, a first input of amplifier 215 receives VBG as output from band-gap voltage generator circuit 205. An output of amplifier 215 is coupled to a gate of p-transistor 230 and a gate of p-transistor 235. A source of p-transistor 230 and a source of p-transistor 235 are coupled to a reference voltage such as VCC or the like. A drain of p-transistor 230 is coupled to resistor R3 through circuit node C. A signal take from circuit node C is provided to a second input of amplifier 215 as a feedback signal forming a feedback loop. A drain of p-transistor 235 is coupled to a drain of n-transistor 240. Further, the gate of n-transistor 240 is coupled to the drain of n-transistor 240.

In the example shown in FIG. 2, current mirror 225 includes a p-transistor 245 and an n-transistor 250. A gate of p-transistor 245 is coupled to the gates of p-transistors 230 and 235. A source of p-transistor 245 is coupled to VCC, while a drain of p-transistor 245 is coupled to a drain of n-transistor 250 through circuit node D. A signal taken from circuit node D represents the output of divider circuit block 110, which provides VBG_TRIM. For purposes of clarity, control signals 120 and the circuitry associated with control signals 120 are not illustrated in FIG. 2.

Processing circuit block 102 further includes a p-transistor 255, a resistor R1, and a resistor R2. As pictured, an output from amplifier 210 is coupled to a gate of p-transistor 255. A source of p-transistor 255 is coupled to VCC, while a drain of p-transistor 255 is coupled to resistor R1 through circuit node A. Resistor R1 is coupled to resistor R2 in series through circuit node B. An output from processing circuit block 102 is taken from circuit node A, which represents VGG, e.g., the output reference voltage. Processing circuit block 102 receives VBG_TRIM, which is output from divider circuit block 110, at circuit node B as an input.

Within trimming circuit 100, the current through resistor R1, denoted as IR1, is determined from expression 1 below.

$$IR1 = (TAP\_VGG/R2) \pm (M*VBG/R3) \quad (1)$$

Accordingly, the voltage drop across resistor R1, denoted as VR1, is determined from expression 2 below.

$$VR1 = R1*((TAP\_VGG/R2) \pm (M*VBG/R3)) \quad (2)$$

The feedback path established for amplifier 210 extends from the output of amplifier 210, through p-transistor 255, through resistor R1, to circuit node B, and back to the second input of amplifier 210. This feedback path forces the voltage at circuit node B to track the voltage of TAP_VGG. Thus, the voltage at circuit node A, which is the output VGG, can be determined by adding the voltage drop across resistor R1 to the voltage at node B, which is presumed to be TAP_VGG. Accordingly, VGG can be calculated as VGG=TAP_VGG+VR1, which is shown below as expression 3 where VR1 is replaced with expression 2.

$$VGG = TAP\_VGG + [R1*((TAP\_VGG/R2) \pm (M*VBG/R3))] \quad (3)$$

Expression 3 can be simplified to expression 4 below.

$$VGG = TAP\_VGG(1+R1/R2) \pm (R1*M*VBG/R3) \quad (4)$$

Within expression 4, the term "R1*M*VBG/R3" is the trim term and, as such, specifies the voltage level of VBG_TRIM as provided to circuit node B from circuit node D. Within the trim term, the variable "M" represents the either the number of p-transistors or the number of n-transistors that are turned on in current mirror 225. With a single current mirror, the value of M may be 0, 1, or −1 as described in further detail below. In implementations where a current mirror structure having two or more current mirrors are used, the value of "M" represents the total number of either p-transistors or n-transistors of the current mirrors that are turned on or activated. Referring again to FIG. 2, only n-transistor 250 or p-transistor 245 is turned on at any given time within current mirror 245 based upon the value of control signal 120. Thus, the value of M is determined from control signal 120.

The trim term includes three quantities. Each of the three quantities, i.e., M, VGB, and R1/R3, is temperature and process independent. In consequence, the value of the trim term within expression 4 is both temperature and process independent. Similarly, the term (1+R1/R2) includes only quantities, i.e., 1 and R1/R2, that are both temperature and process independent. It should be appreciated that while R1 and R2 may be process dependent when viewed independently, the quantity R1/R2 is process independent. While TAP_VGG is temperature dependent, the remainder of expression 4 that determines the value of VGG includes only process and temperature independent terms. Since the trim term is added or subtracted, the temperature coefficient of VGG is not changed by trimming through summing of the trim term.

Figure 3:
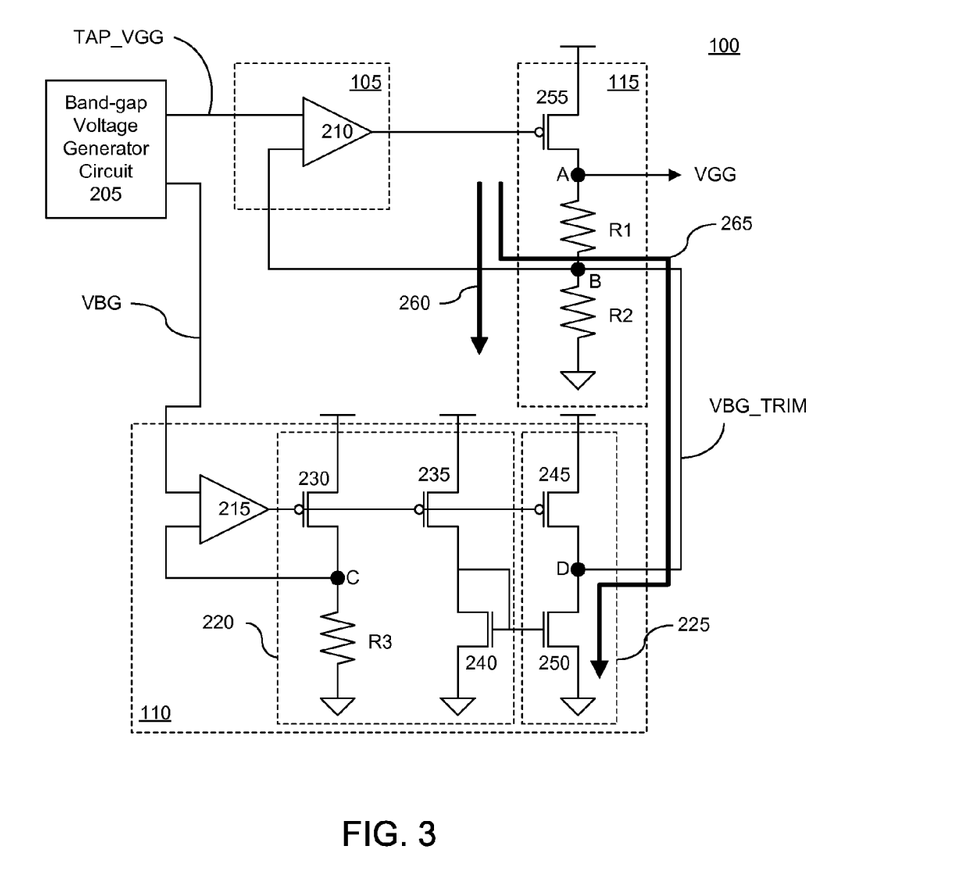
FIG. 3 is a block diagram illustrating an exemplary mode of operation of the trimming circuit of FIG. 2.

FIG. 3 is a block diagram illustrating an exemplary mode of operation of trimming circuit 100 as described with reference to FIG. 2. FIG. 3 illustrates the value of VGG in the case where p-transistor 245 within current mirror 225 is turned off and n-transistor 250 within current mirror 225 is turned on. In this example, "M" represents the number of either n-transistors or p-transistors within the trim term that are turned on. The trim term is either positive or negative depending upon whether the p-transistor or the n-transistor of current mirror 225 is turned on. As noted, the particular transistor(s) that are turned on within the current mirror structure are determined by control signal 120.

In the example of FIG. 3, arrow 260 represents current flow through circuit node A that is contributed from the output of amplifier 210 through p-transistor 255. Arrow 265 represents current flow that is contributed to node A from divider circuit block 110. With p-transistor 245 turned off and n-transistor 250 turned on, current flows in accordance with arrow 265 from circuit node A, through resistor R1, to circuit node D, and through n-transistor 250 to ground. Thus, the current represented by arrow 265 is cumulative or additive with the current represented by arrow 260 from the perspective of circuit node A. The cumulative currents cause an increased voltage drop across resistor R1 and an increase in the voltage at circuit node A over the case where no trimming, i.e., M=0, is performed. The voltage of VBG_TRIM, as specified by the trim term, increases VGG, i.e., trims VGG higher. In that case, the sign of the trim term R1*M*VGB/R3 is positive. Alternatively, viewed another way, the variable M is equal to +1. Referring to expression 4, VGG is equal to TAP_VGG (1+R1/R2)+(R1*M*VBG/R3). In the case where M=0, VGG is equal to TAP_VGG (1+R1/R2).

Figure 4:
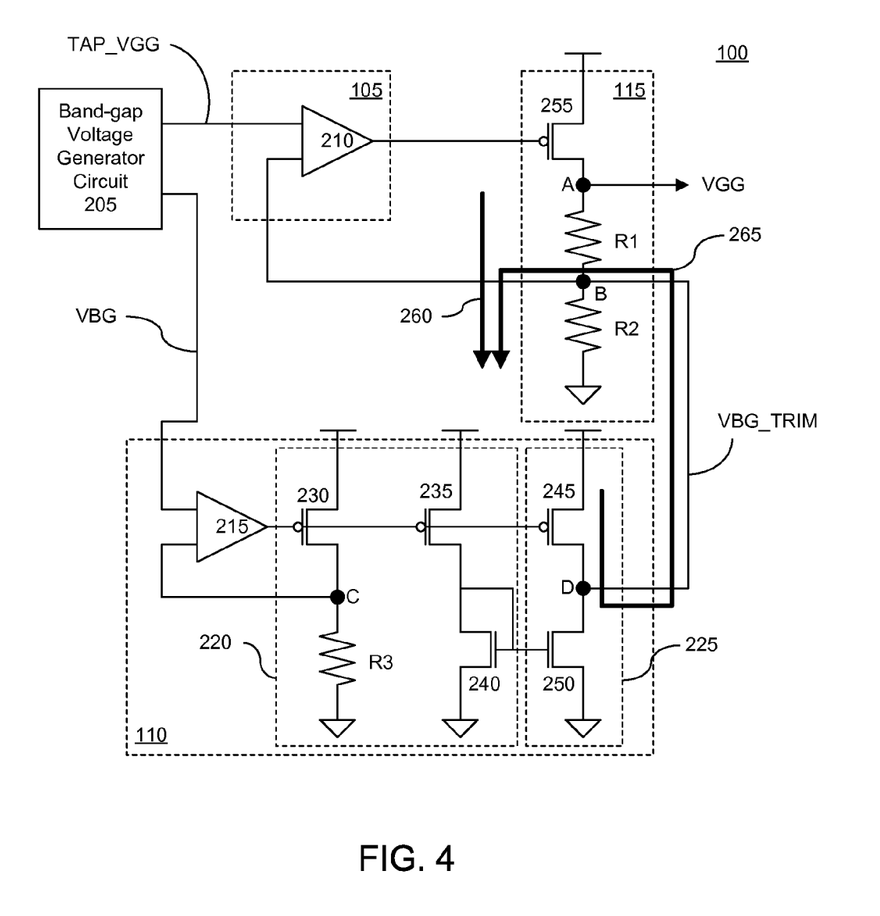
FIG. 4 is a block diagram illustrating another exemplary mode of operation of the trimming circuit of FIG. 2.

FIG. 4 is a block diagram illustrating another exemplary mode of operation of trimming circuit 100 as described with reference to FIG. 2. FIG. 4 illustrates the value of VGG in the case where p-transistor 245 within current mirror 225 is turned on and n-transistor 250 within current mirror 225 is turned off. In this example, "M" represents the number of p-transistors within current mirror 245 that are turned on as specified by control signal 120 (not shown).

In the example of FIG. 4, arrow 260 represents the current flow through circuit node A that is contributed from the output of amplifier 210 through p-transistor 255. Arrow 265 represents the current that is contributed to circuit node A from divider circuit block 110. With p-transistor 245 turned on and n-transistor 250 turned off, current flows in accordance with arrow 265 through p-transistor 245 to circuit node D, to circuit node B, through resistor R2, to ground. Thus, the current represented by arrow 265 offsets, e.g., is subtracted from, the current represented by arrow 260 from the perspective of circuit node A. The offsetting currents cause a reduced voltage drop across resistor R1 and a reduction in the voltage at circuit node A over the case where no trimming, i.e., M=0, is performed. The voltage of VBG_TRIM, as represented by the trim term, reduces VGG, i.e., trims VGG lower. As such, the sign of the trim term M*VGB/R3 is negative. Alternatively, viewed another way, the variable M is equal to −1. Referring to expression 4, VGG is equal to TAP_VGG (1+R1/R2)−(R1*M*VBG/R3).

Figure 5:
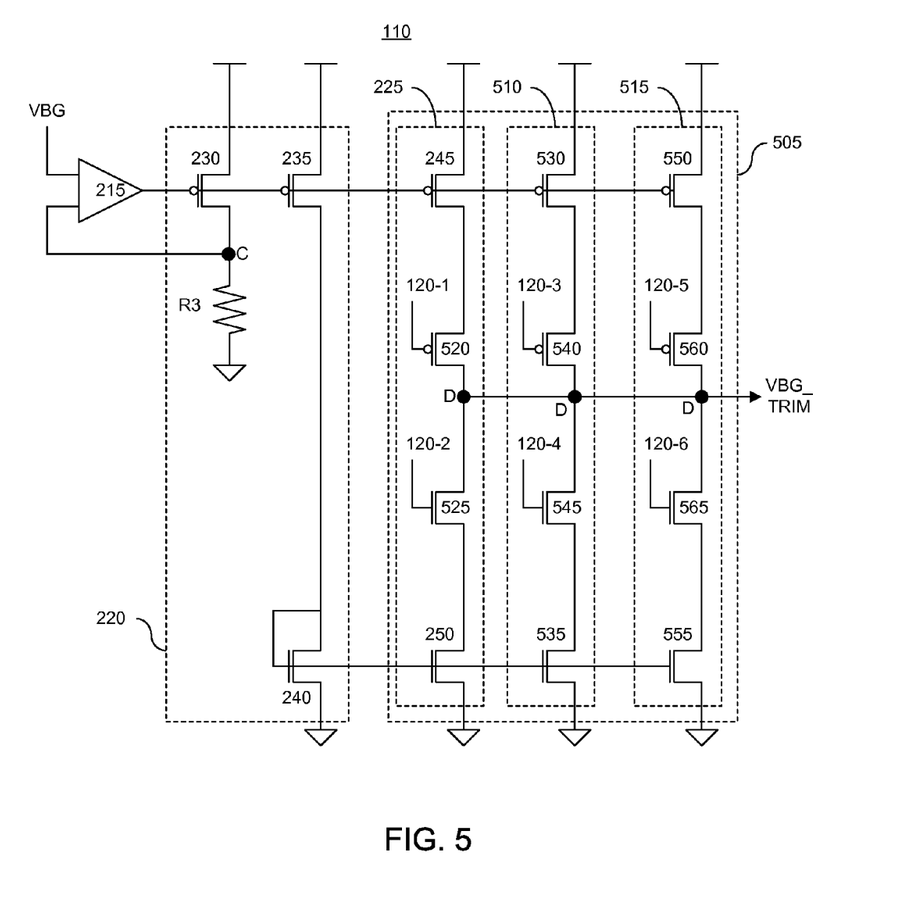
FIG. 5 is a circuit diagram illustrating an exemplary divider circuit block.

FIG. 5 is a circuit diagram illustrating an exemplary divider circuit block. FIG. 5 illustrates an exemplary implementation of divider circuit block 110 of trimming circuit 100 as described with reference to FIG. 2. FIG. 5 presents a more detailed view of divider circuit block 110 that includes control signals 120 and the circuitry attached thereto.

In general, divider circuit block 110 is implemented substantially as described with reference to FIGS. 1-4 of this disclosure. For purposes of illustration, divider circuit block 110 includes a current mirror structure 505 that includes more than one current mirror. More particularly, current mirror structure 505 includes current mirror 225 and two additional current mirrors 510 and 515.

As pictured, each of current mirrors 225, 510, and 515 includes additional control circuitry. Current mirror 225 includes an inner transistor pair forming the control circuitry of current mirror 225. The control circuitry of current mirror 225 allows p-transistor 245 and/or n-transistor 250 to be turned on and off based upon the control signals provided thereto. The control circuitry of current mirror 225 is formed of a control p-transistor (control transistor) 520 and a control n-transistor (control transistor) 525. The drain of p-transistor 245 is coupled to a source of control transistor 520. A drain of control transistor 520 is coupled to a drain of control transistor 525 through node D. A source of control transistor 525 is coupled to a drain of n-transistor 250.

For purposes of clarity and ease of illustration, the "p-" and "n-" designations of the various transistors are not used throughout the remainder of the description of FIG. 5. As discussed, control signal 120 may be implemented as a multi-bit control signal. Accordingly, control signal 120-1 is coupled to a gate of control transistor 520. When control signal 120-1 turns off control transistor 520, transistor 245 is turned off, e.g., deactivated. Control signal 120-2 is coupled to a gate of control transistor 525. When control signal 120-2 turns off control transistor 525, transistor 250 is turned off.

Control signals 120-1 and 120-2 will function cooperatively to either turn off both of control transistors 520 and 525 or turn on only one of control transistors 520 or 525. When both control transistors 520 and 525 are turned off, current mirror 225 does not contribute to the value of M for the trim term. When control transistor 525 is turned on, current flows through control transistor 525 and transistor 250, which is illustrated in FIG. 3. In that case, current mirror 225 contributes a value of +1 to M corresponding to transistor 250 being turned on. For purposes of determining the value of M, control transistors are not counted. When control transistor 520 is turned on, current flows through control transistor 520 and transistor 245, which is illustrated in FIG. 4. In that case, current mirror 225 contributes a value of −1 to M corresponding to transistor 245 being turned on.

Current mirror 510 includes transistors 530 and 535 and control transistors 540 and 545. Control signal 120-3 is coupled to a gate of control transistor 540. Control signal 120-4 is coupled to a gate of control transistor 545. Current mirror 515 includes transistors 550 and 555 and control transistors 560 and 565. Control signal 120-5 is coupled to a gate of control transistor 560. Control signal 120-6 is coupled to a gate of control transistor 565. Current mirrors 510 and 515 are implemented identically to current mirror 225. Accordingly, the operation of each current mirror relating to the use of controls signals is not described to avoid duplication.

Referring to the operation of current mirror structure 505 as a whole, in one exemplary mode of operation, each of the constituent current mirrors is off, in which case the value of M is zero. When M is zero, no trimming is applied. In another exemplary mode of operation, one or more or all of transistors 250, 535, and/or 555 are turned on. The value of M is the number transistors 250, 535, and/or 555 that are turned on and is positive. In still another exemplary mode of operation, one or more or all of transistors 245, 530, and/or 550 are turned on. In that case, the value of M is the number of transistors 245, 530, and/or 550 that are turned on and is negative. Thus, within current mirror structure 505, only the n-transistor(s) or only the p-transistor(s) of each active current mirror are on. Current mirror structure 505, in accordance with possible values of control signal 120, does not activate both n-transistors and p-transistors concurrently within a single current mirror or across multiple current mirrors.

Figure 6:
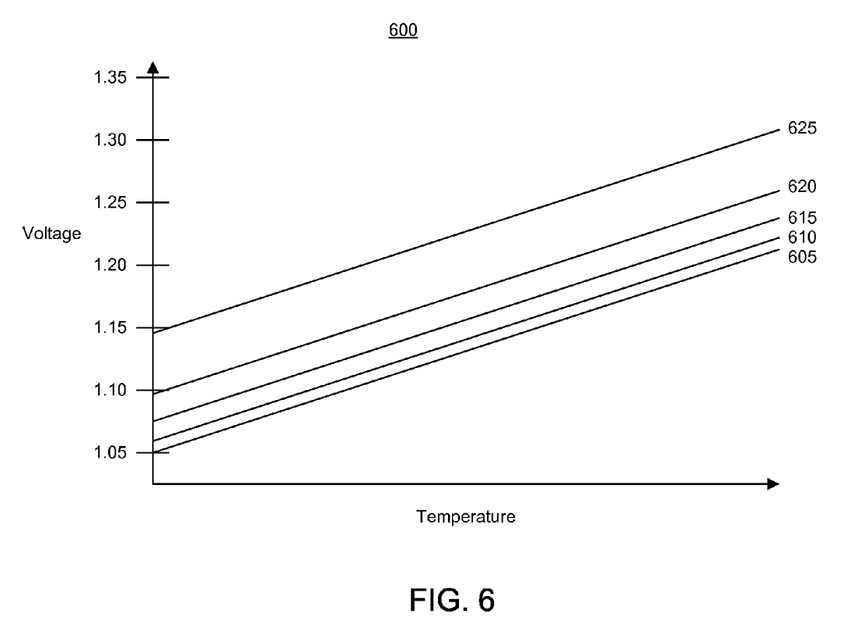
FIG. 6 is a graph illustrating different plots of VGG over a defined temperature range for a plurality of different trim terms.

FIG. 6 is a graph 600 illustrating different plots of VGG over a defined temperature range for a plurality of different trim terms. The vertical axis represents voltage, while the horizontal axis represents temperature. FIG. 6 illustrates a plurality of plots 605, 610, 615, 620, and 625 of VGG against temperature for increasing values of M.

Plot 605 represents a plot of VGG without any trimming. Plot 605 represents the value of VGG with M, and thus the trim term R1*M*VBG/R3, set to zero. More particularly, control signal 120 sets the value of M to zero meaning that none of the current mirrors in the current mirror structure of the dividing circuit block are active. Plot 605 represents an untrimmed VGG, which is specified by the expression TAP_VGG (1+R1/R2).

Plot 610 represents a plot of VGG where the control signal turns on the n-transistor in a first current source. The value of M is equal to one. As illustrated, the slope of plot 610 is effectively equivalent to the slope of plot 605. The trim term changes the offset of plot 610 with respect to plot 605 without changing the slope. A changed slope in plot 610 would represent a change in the temperature coefficient of VGG, which does not occur using a trimming circuit as described within this disclosure.

Plot 615 represents a plot of VGG where the control signal turns on the n-transistor in a first current source and in a second current source. The value of M is equal to two. As illustrated, the slope of plot 615 is effectively equivalent to the slope of plots 605 and 610. The trim term changes the offset of plot 615 with respect to plot 610 and plot 605 without changing the slope. Again, the plot of VGG is changed by trimming the offset through addition (or subtraction) without changing slope.

Plots 620 and 625 illustrate examples in which M is set equal to 3 and 4, respectively. Plots 620 and 625 illustrate similar characteristics in that further increase in the value of the trim term by increasing M changes the offset of plot 620 and plot 625 without changing the slope of either plot.

FIG. 6 illustrates that a trimming circuit as described within this disclosure applies trimming in a manner that is independent, or substantially independent, of the value of TAP_VGG. Trimming is applied using the trim term through a summing process as opposed to prior trimming techniques that sought only to vary gain, e.g., utilize multiplication. Variation in the gain resulted in a change in slope which is indicative of a change in the temperature coefficient in VGG. By trimming through summing to change the offset of the VGG plot over temperature, the temperature coefficient of VGG is not changed. The trim term, as discussed, is both temperature and process independent.

Figure 7:
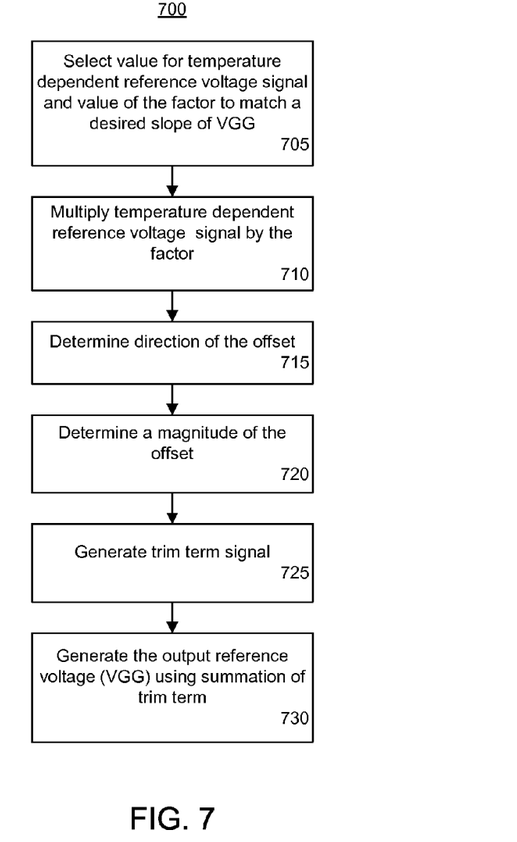
FIG. 7 is a flow chart illustrating an exemplary method of trimming a temperature dependent reference voltage.

FIG. 7 is a flow chart illustrating an exemplary method 700 of trimming a temperature dependent reference voltage. Method 700 illustrates a trimming approach that utilizes summing applied to an offset of VGG as opposed to a variation in gain of a multiplication circuit block to perform trimming.

In block 705, a value for a temperature dependent reference voltage signal and a value of the factor applied to the temperature dependent reference voltage signal are selected. As noted, the temperature dependent reference voltage signal is TAP_VGG. In one aspect, the factor applied by the processing circuit block, e.g., the multiplication circuit block, is "1+R1/R2." An exemplary value of the factor is 1.23. It should be appreciated, however, that any of a variety of different factor values may be used depending upon the desired slope and the value of TAP_VGG.

In block 710, the temperature dependent reference voltage signal is multiplied by the factor. Accordingly, the resulting signal generated by the multiplication circuit block or multiplication operation is TAP_VGG(1+R1/R2). The value of TAP_VGG, the value of the factor, or both are selected to obtain a desired slope of VGG across a defined temperature range.

In block 715, a direction of the offset applied to VGG is determined. If the desired plot of VGG over the temperature range is to be increased, the direction of the offset is positive as is the trim term R1*M*VBG/R3. Accordingly, only one or more n-transistors of the current sources are turned on, while all p-transistors of the current sources are turned off. If the desired plot of VGG over the temperature range is to be decreased, the direction of the offset is negative as is the trim term. In that case, only one or more p-transistors of the current sources are turned on, while all n-transistors of the current sources are turned off.

In block 720, a magnitude of the offset is determined. The magnitude of the offset is determined by selecting an absolute value of M within the trim term. The absolute value of M specifies the number of the selected type of transistors of the current mirror(s) that are turned on. More particularly, when non-zero, the value of M determines either the number of n-transistors or the number of p-transistors turned on depending upon whether the trim term is positive or negative. Since each current mirror has at most one transistor turned on (exclusive of control transistors), the value of M indicates the number of active current mirrors in the current mirror structure in reference to the number of current mirrors with one transistor turned on or activated.

In block 725, the trim term signal is generated. The trim term signal is VBG_TRIM. A divisor, for example, that may be used by the divider circuit block in determining the trim term can be R3, which results in a resistor ratio of R1/R3 within the trim term.

In block 730, the output reference voltage, i.e., VGG, is generated through summation of the trim term. VGG is generated, at least in part, by summing the trim term with the result from multiplying the temperature dependent reference voltage signal (TAP_VGG) by the factor (1+R1/R2). As discussed, currents directed to circuit node B are summed, which results in a voltage drop across resistor R1 and the reference voltage VGG at circuit node A. VGG, as output from circuit node A, is either trimmed when M is non-zero or is not trimmed when M equals zero.

Figure 8:
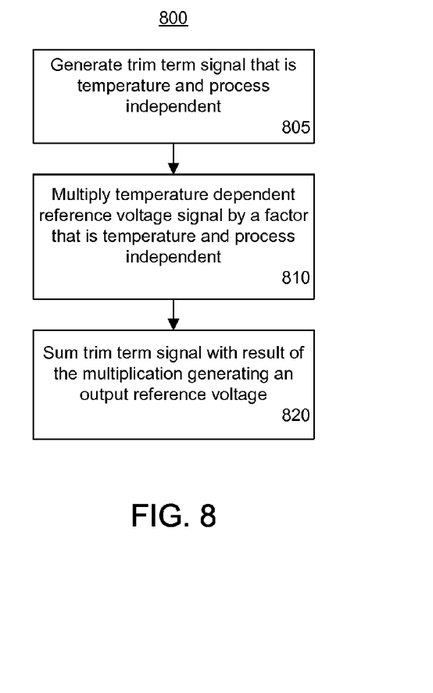
FIG. 8 is a flow chart illustrating another exemplary method of trimming a temperature dependent reference voltage.

FIG. 8 is a flow chart illustrating an exemplary method 800 of trimming a temperature dependent reference voltage. Method 800 illustrates a trimming approach that utilizes summing applied to an offset of VGG as opposed to a variation in gain of a multiplication circuit block to perform trimming.

In block 805, a trim term reference voltage signal is generated. The trim term reference voltage signal is temperature and process independent. For example, the trim term signal has a voltage that is a product of a band-gap reference voltage signal, e.g., VBG, a ratio of a first resistive value corresponding to R1 and a second resistive value corresponding to R3, and a number of active transistors of a selected type within a current mirror structure indicated by M from which the trim term signal is output. As noted, the band-gap reference voltage signal is temperature and process independent.

In block 810, a temperature dependent reference voltage signal, e.g., VGG_TAP, is multiplied by a factor that is temperature and process independent. In one aspect, the factor is (1+R1/R2). In block 815, the trim term signal is summed with a result of the multiplication thereby generating an output reference voltage. The output reference voltage is VGG.

The arrangements described within this disclosure trim a temperature dependent reference voltage through the summation of a trim term. The slope of a plot of VGG over a defined temperature range is set and maintained constant by setting the value of a first reference voltage and a factor applied to the first reference voltage. A trim term is summed with a result of the multiplication. Because the trim term is applied by addition or subtraction and is both temperature and process independent, the slope set by the value of the first reference voltage and the factor is unchanged by application of the trim term. As such, the temperature coefficient of VGG is unchanged through summation of the trim term. Accordingly, any of a variety of different VGG plots with different offsets over the defined temperature range can be obtained through variation of the trim term as described where each such plot has a same, or substantially same, slope. As a result, the value of VGG over the defined temperature range can be tuned more accurately than is the case using other techniques that rely solely upon application of gain.

For purposes of explanation, specific nomenclature is set forth to provide a thorough understanding of the various inventive concepts disclosed herein. The terminology used herein, however, is for the purpose of illustrating the features described and is not intended to be limiting.

For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system. The term "connected" means that the elements that are connected are physically coupled to one another.

The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The various transistors described within this specification may be implemented as Metal Oxide Semiconductor Field Effect Transistors (MOSFETs), whether of the n or p varieties. The transistors also may be implemented using other technologies. As such, the exemplary transistor types provided are not intended to be limiting of the various arrangements of the trimming circuit described within this disclosure.

The flowchart and block diagrams in the figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:

1. A circuit, comprising:
   a divider circuit block configured to generate a trim term signal that is temperature and process independent; and
   a processing circuit block configured to multiply a temperature dependent reference voltage signal by a factor, and to sum the trim term signal with a result of the multiplication to generate an output reference voltage;
   wherein the divider circuit block comprises:
      a first amplifier comprising a first input coupled to a band-gap reference voltage signal and a second input;
      an output stage comprising a first p-transistor, a second p-transistor, a first resistor, and a first n-transistor, wherein the first p-transistor comprises a gate coupled to an output of the first amplifier and a drain coupled to the second input of the first amplifier, the second p-transistor comprises a gate coupled to the output of the first amplifier, the first resistor is coupled to the drain of the first p-transistor, and the first n-transistor comprises a drain and a gate coupled to a drain of the second p-transistor;
      at least one current mirror structure comprising a third p-transistor, control circuitry, and a second n-transistor, wherein the third p-transistor comprises a gate coupled to the output of the first amplifier, the control circuitry is coupled to a drain of the third p-transistor and comprises an output node configured to output the trim term signal, and the second n-transistor comprises a gate coupled to the gate of the first n-transistor and a drain coupled to the control circuitry;
   wherein the processing circuit block comprises:
   a second amplifier comprising a first input configured to receive the temperature dependent reference voltage signal and a second input;
   a fourth p-transistor having a gate coupled to an output of the second amplifier;
   a second resistor having a first end coupled to a drain of the fourth p-transistor forming a circuit node that generates the output reference voltage; and
   a third resistor having a first end coupled in series to a second end of the second resistor; and
   wherein the second input of the second amplifier is directly coupled to the second end of the second resistor forming a feedback loop and is directly coupled to the output node of the control circuit.

2. The circuit of claim 1, wherein:
   the trim term signal has a voltage equal to a trim term; and
   the trim term is a product of a band-gap reference voltage signal, a ratio of a first resistive value and a second resistive value, and a number of active transistors of a selected type within the current mirror structure of the divider circuit block.

3. The circuit of claim 2, wherein the trim term is positive or negative according to whether the third p-transistor or the second n-transistor of the current mirror structure is turned on.

4. The circuit of claim 1, wherein the control circuitry comprises n-mos and p-mos control circuitry configured to turn off both of the third p-transistor and the second n-transistor concurrently, turn on only the third p-transistor, or turn on only the second n-transistor.

5. The circuit of claim 1, wherein:
the trim term signal is R1*M*(a band-gap reference voltage signal)/R3;
the output reference voltage equals the temperature dependent reference voltage signal multiplied by 1+R1/R2 and summed with the trim term signal; and
R1 is a value of the second resistor, R2 is a value of the third resistor, R3 is a value of the first resistor, and M is an integer value specifying a number of active transistors of the current mirror structure of the divider circuit block.

6. A method of trimming a temperature dependent reference voltage, the method comprising:
generating a trim term signal that is temperature and process independent;
multiplying, using a processing circuit block, a temperature dependent reference voltage signal by a factor that is temperature and process independent; and
summing, using the processing circuit block, the trim term signal with a result of the multiplication generating an output reference voltage;
wherein the trim term signal is generated by:
an amplifier comprising a first input coupled to a band-gap reference voltage signal and a second input;
an output stage comprising a first p-transistor, a second p-transistor, a first resistor, and a first n-transistor, wherein the first p-transistor comprises a gate coupled to an output of the amplifier and a drain coupled to the second input of the amplifier, the second p-transistor comprises a gate coupled to the output of the amplifier, the resistor is coupled to the drain of the first p-transistor, and the first n-transistor comprises a drain and a gate coupled to a drain of the second p-transistor;
a current mirror structure comprising a third p-transistor, control circuitry, and a second n-transistor, wherein the third p-transistor comprises a gate coupled to the output of the amplifier, the control circuitry is coupled to a drain of the third p-transistor and comprises an output node configured to output the trim term signal, and the second n-transistor comprises a gate coupled to the gate of the first n-transistor and a drain coupled to the control circuitry; and
wherein the trim term signal has a voltage that is a product of a band-gap reference voltage signal, a ratio of a first resistive value and a second resistive value, and a number of active transistors of a selected type within the current mirror structure from which the trim term signal is output; and
wherein the processing circuit block comprises:
a second amplifier comprising a first input configured to receive the temperature dependent reference voltage signal and a second input;
a fourth p-transistor having a gate coupled to an output of the second amplifier;
a second resistor having a first end coupled to a drain of the fourth p-transistor forming a circuit node that generates the output reference voltage; and
a third resistor having a first end coupled in series to a second end of the second resistor; and
wherein the second input of the second amplifier is directly coupled to the second end of the second resistor forming a feedback loop and is directly coupled to the output node of the control circuit.

7. The method of claim 6, wherein:
the trim term signal has a voltage of R1*M*(a band-gap reference voltage signal)/R3;
the output reference voltage equals the temperature dependent reference voltage signal multiplied by 1+R1/R2 and summed with the trim term signal; and
R1 is a value of a second resistor, R2 is a value of a third resistor in series with the second resistor, R3 is a value of the first resistor, and M is an integer value specifying a number of active transistors of the current mirror structure from which the trim term signal is output.

8. A circuit, comprising:
a first amplifier comprising a first input coupled to a band-gap reference voltage signal and a second input;
an output stage coupled to an output of the first amplifier;
a current mirror structure coupled to an output of the output stage;
a second amplifier comprising a first input configured to receive a temperature dependent reference voltage signal and a second input;
a first p-transistor having a gate coupled to an output of the second amplifier;
a first resistor having a first end coupled to a drain of the first p-transistor, wherein the first end of the first resistor forms a circuit node that generates an output voltage reference; and
a second resistor having first end coupled in series to a second end of the first resistor;
wherein the second input of the second amplifier is directly coupled to the second end of the first resistor forming a feedback path;
wherein the current mirror structure comprises a second p-transistor, control circuitry, and a first n-transistor, wherein the second p-transistor comprises a gate coupled to the output of the first amplifier, the control circuitry is coupled to a drain of the second p-transistor, and the first n-transistor comprises a gate coupled to a gate of a second n-transistor of the output stage and a drain coupled to the control circuitry;
wherein the control circuitry is n-mos and p-mos control circuitry directly coupled to the second end of the first resistor.

9. The circuit of claim 8, wherein:
the band-gap reference voltage signal is temperature and process independent; and
the output stage comprises:
a third p-transistor having a gate coupled to an output of the first amplifier and a drain coupled to the second input of the first amplifier;
a fourth p-transistor having a gate coupled to the output of the first amplifier;
a third resistor coupled to the drain of the third p-transistor; and
the second n-transistor having a drain and a gate coupled to a drain of the fourth p-transistor.

10. The circuit of claim 9, wherein the current mirror structure comprises:
at least one current mirror.

11. The circuit of claim 8, wherein the control circuitry is configured to turn off both of the second p-transistor and the first n-transistor concurrently, turn on only the second p-transistor, or turn on only the first n-transistor.

12. The circuit of claim 8, wherein:
the current mirror is configured to output a trim term signal having a voltage of R1*M*(the band-gap reference voltage signal)/R3;
the output reference voltage equals the temperature dependent reference voltage signal multiplied by 1+R1/R2 and summed with the trim term signal; and
R1 is a value of the first resistor, R2 is a value of the second resistor, R3 is a value of a third resistor, and M is an integer value specifying a number of active transistors of the current mirror structure.

13. The circuit of claim 4, wherein the n-mos and p-mos control circuitry comprises:
a control p-transistor comprising a gate coupled to a first control signal, a source coupled to the drain of the third p-transistor; and
a control n-transistor comprising a gate coupled to a second control signal, a source coupled to a drain the second n-transistor;
wherein a drain of the control p-transistor is directly coupled to a drain of the control n-transistor forming the output node of the control circuitry.

14. The method of claim 6, wherein the n-mos and p-mos control circuitry comprises:
a control p-transistor comprising a gate coupled to a first control signal, a source coupled to the drain of the third p-transistor; and
a control n-transistor comprising a gate coupled to a second control signal, a source coupled to a drain the second n-transistor;
wherein a drain of the control p-transistor is directly coupled to a drain of the control n-transistor forming the output node of the control circuitry.

15. The circuit of claim 8, wherein the n-mos and p-mos control circuitry comprises:
a control p-transistor comprising a gate coupled to a first control signal, a source coupled to the drain of the second p-transistor; and
a control n-transistor comprising a gate coupled to a second control signal, a source coupled to a drain the first n-transistor;
wherein a drain of the control p-transistor is directly coupled to a drain of the control n-transistor forming the output node of the control circuitry.

* * * * *